(12) United States Patent
Cheng et al.

(10) Patent No.: US 9,099,324 B2
(45) Date of Patent: Aug. 4, 2015

(54) SEMICONDUCTOR DEVICE WITH TRENCH ISOLATION

(71) Applicant: TAIWAN SEMICONDUCTOR MANUFACTURING CO., LTD., Hsinchu (TW)

(72) Inventors: Yu-Hung Cheng, Tainan (TW); Cheng-Ta Wu, Shueishang Township (TW); Yeur-Luen Tu, Taichung (TW); Chia-Shiung Tsai, Hsin-Chu (TW); Ru-Liang Lee, Hsinchu (TW); Tung-I Lin, Tainan (TW); Wei-Li Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/062,838

(22) Filed: Oct. 24, 2013

(65) Prior Publication Data

US 2015/0115397 A1      Apr. 30, 2015

(51) Int. Cl.
*H01L 21/76*     (2006.01)
*H01L 29/06*     (2006.01)
*H01L 21/762*    (2006.01)

(52) U.S. Cl.
CPC ...... *H01L 29/0649* (2013.01); *H01L 21/76224* (2013.01); *H01L 21/76237* (2013.01)

(58) Field of Classification Search
CPC ................. H01L 21/76224; H01L 21/76237; H01L 29/0649
USPC ................. 438/296, 429; 257/510, E21.546, 257/E21.551, E21.571
See application file for complete search history.

(56) References Cited

U.S. PATENT DOCUMENTS

| 7,947,551 | B1  |   | 5/2011 | Syue et al. |
|-----------|-----|---|--------|-------------|
| 2002/0001891 | A1 | * | 1/2002 | Kim et al. ................. 438/197 |
| 2007/0178703 | A1 | * | 8/2007 | Partridge et al. ............ 438/706 |
| 2009/0096055 | A1 | * | 4/2009 | Montgomery et al. ....... 257/510 |

OTHER PUBLICATIONS

Shallow Trench Isolation, Encyclopedia of Materials: Science and Technology pp. 8437-8445 (2001).
Molecular Expressions Optical Microscopy Primer Digital Imaging in Optical Microscopy, http://micro.magnet.fsu.edu/primer/digitalimaging/cmosimagesensors.html. <Retrieved from the internet on Feb. 23, 2012>.
U.S. Appl. No. 13/677,406, filed May 15, 2014.

* cited by examiner

*Primary Examiner* — Kimberly Rizkallah
*Assistant Examiner* — Maria Ligai
(74) *Attorney, Agent, or Firm* — McDermott Will & Emery LLP

(57) ABSTRACT

A semiconductor device includes a semiconductor substrate and a trench isolation. The trench isolation is located in the semiconductor substrate, and includes an epitaxial layer and a dielectric material. The epitaxial layer is in a trench of the semiconductor and is peripherally enclosed thereby, in which the epitaxial layer is formed by performing etch and epitaxy processes. The etch and epitaxy process includes etching out a portion of a sidewall of the trench and a portion of a bottom surface of the trench and forming the epitaxial layer conformal to the remaining portion of the sidewall and the remaining portion of the bottom surface. The dielectric material is peripherally enclosed by the epitaxial layer.

20 Claims, 8 Drawing Sheets

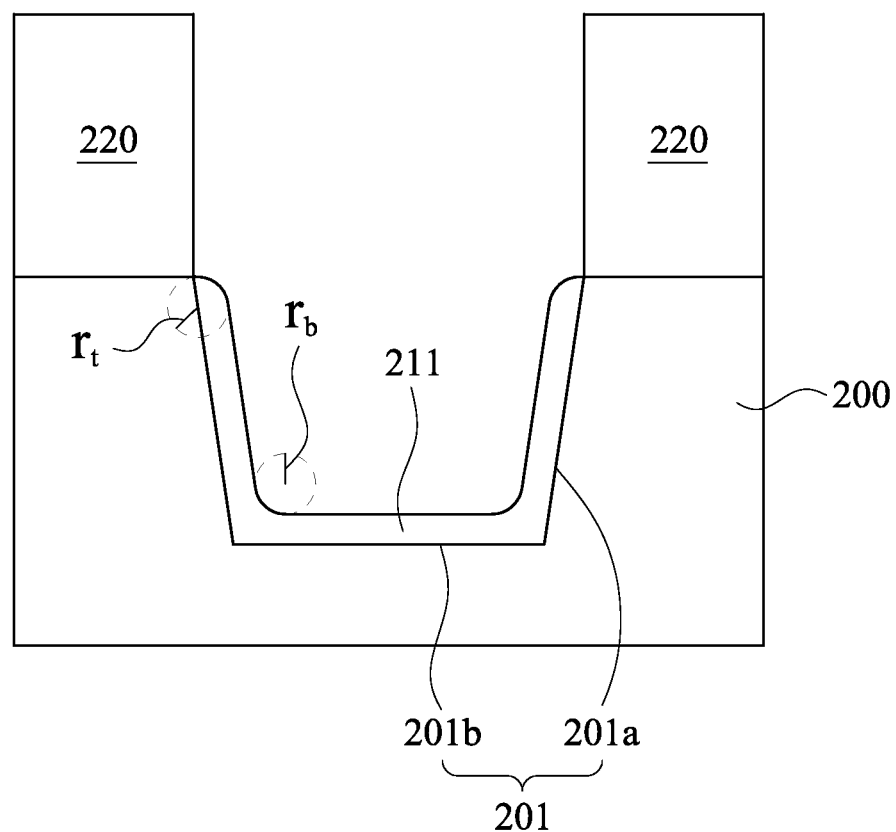
FIG. 2C1

FIG. 2C2

SEMICONDUCTOR DEVICE WITH TRENCH ISOLATION

FIELD

The present disclosure relates to a semiconductor device, and more particularly, to a semiconductor device with a trench isolation.

BACKGROUND

Generally, shallow trench isolations (STIs) are used to separate and isolate active areas, such as logic planar or FinFET transistors, photo diodes, memory cells and SRAM cells on a semiconductor substrate from each other. The STIs are formed by etching trenches, forming silicon oxide liners in the trenches, overfilling the trenches with a dielectric such as an oxide, and then removing any excess dielectric outside the trenches. This dielectric helps to electrically isolate the active areas from each other. Before the trenches are formed, the semiconductor substrate has undergone ion implantation resulting in large roughness and interstitial defects on a surface of the semiconductor substrate. The formation of the trenches requires a photo mask process and an etching process, both of which often cause rough and defective sidewall and bottom surfaces of the trenches. In addition, the rough and defective surface of the semiconductor substrate will make the sidewall and bottom surfaces of the trenches even worse, thus resulting in poor trench isolations. From a top view of each trench, it can be seen that a boundary line intersected between the trench sidewall and the surface of the semiconductor substrate is zigzag, i.e., the trench has a high line edge roughness (LER), which is induced by the photoresist used in the photo mask process, and becomes important for feature sizes on the order of 100 nm or less.

In some techniques, for producing a trench with a smooth surface, a lining oxide layer conformal to the sidewall and bottom surfaces is formed directly after forming a trench. However, the lining oxide layer is still formed imperfectly due to the high roughness of the sidewall and bottom surfaces, and hence the trench isolation is adversely affected. In addition, a field implantation is further used after the formation of the lining oxide layer. However, the field implantation often causes implant damages to sidewall and bottom surfaces of the trench.

Besides, the photo mask process and the etching process generally have the difficulties in controlling a rounding radius of a top corner of the trench (located between the sidewall of the trench and the surface of the semiconductor substrate) and a rounding radius of a bottom corner of the trench (located between the sidewall and the bottom surface of the trench). Such uncontrollable rounding radiuses are disadvantageous to forming the trench isolations and filling STIs with dielectric films, especially for high aspect ratio trench isolations.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 2A-FIG. 2D are schematic cross-sectional views of intermediate stages showing a method for fabricating a semiconductor device in accordance with some embodiments;

DETAILED DESCRIPTION

Figure 1A:
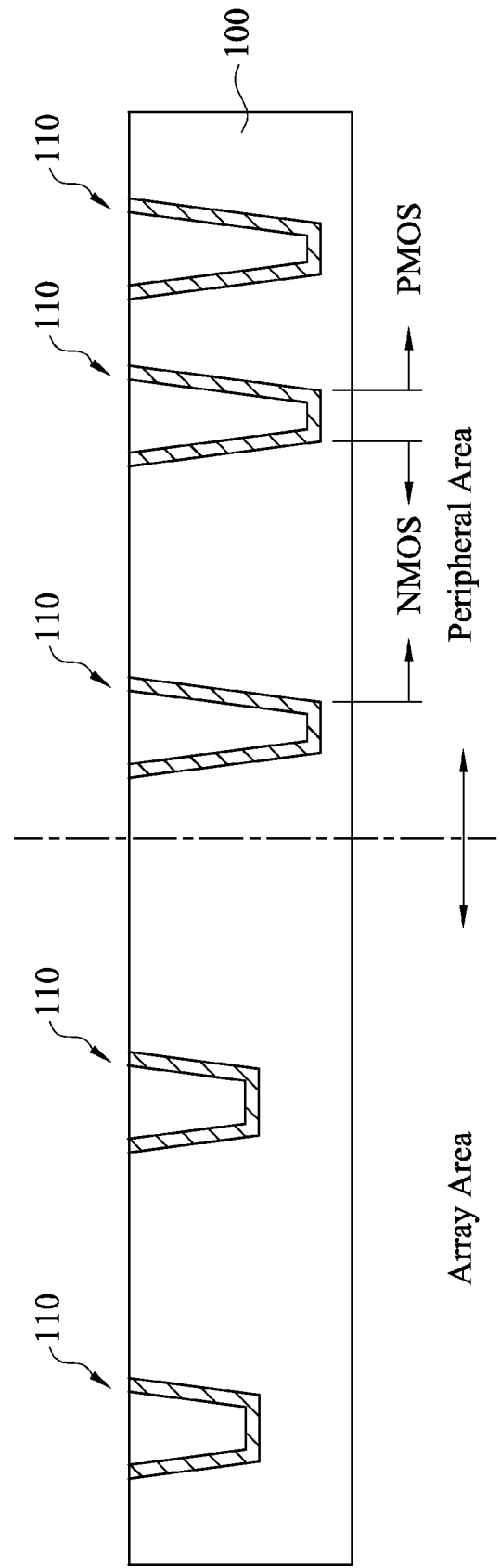
FIG. 1A-FIG. 1C are schematic cross-sectional views of semiconductor devices for various embodiments.

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments. The present disclosure may repeat reference numerals and/or letters in the various examples. This repetition is for the purpose of simplicity and clarity and does not in itself dictate a relationship between the various embodiments and/or configurations discussed.

Embodiments of the present disclosure provide trench isolation designs for semiconductor devices (such as image sensors or logic devices) to isolate components in these devices from each other and to prevent, or at least reduce, high surface roughness and defects of sidewall and bottom surfaces of trenches by using at least one etch and epitaxy process. In the formation process of a trench isolation, a trench is first formed in a semiconductor substrate. Then, at least one etch and epitaxy process is performed to first etch out a portion of the imperfect sidewall and bottom surfaces of the trenches and then grow an epitaxial layer on the remaining portions of the sidewall and bottom surfaces of the trenches, thereby obtaining smooth sidewall and bottom surfaces of the trenches, thus reducing the LER of the trench and smoothing the sidewall and the bottom surface of the trench. Thereafter, a filling process is performed to fill the trench with a dielectric material to form the trench isolation.

According to various embodiments of the present disclosure, the epitaxial layer may include a doped epitaxial layer and an undoped epitaxial layer. The doped epitaxial layer conformal to the sidewall and bottom surfaces of the trench is used to replace the conventional field implantation performed after the formation of the lining oxide layer, thus simplifying the operations for forming the trench isolation.

In some embodiments, profiles of the sidewall and bottom surfaces of the trench can be controlled by repeatedly performing the etch and epitaxy process including an etching out operation for decreasing the thickness t of the sidewall and bottom surfaces and a selective epitaxial growth (SEG) operation for forming an epitaxial layer with low roughness for increasing the thickness of the sidewall and bottom surfaces, in which the SEG operation may slightly etch out a hard mask above the trench, thereby controlling top and bottom corner rounding radius of the trench. In some embodiments, it can also perform by EPI profile without etching step to epitaxy film with controllable STI profile and dopants.

Figure 1B:
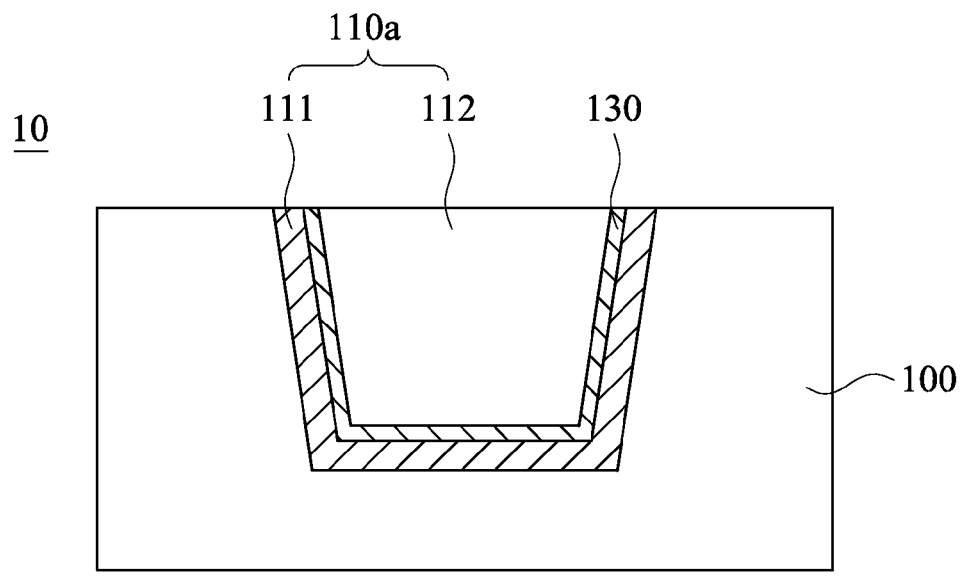
Figure 1C:
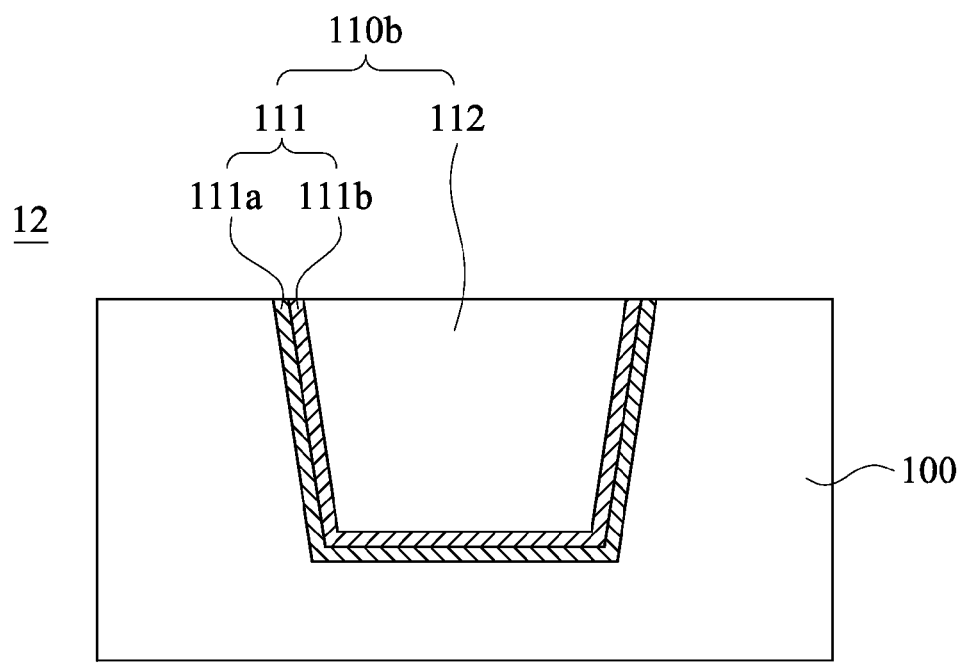

FIG. 1A-FIG. 1C are schematic cross-sectional views showing a semiconductor device for various embodiments. As shown in FIG. 1A, trench isolations 110 are formed in a semiconductor substrate 100. Some trench isolations 110 are STIs used to separate and isolate photo diodes, memory cells or SRAM cells in an array area, and some trench isolations 110 are deep trench isolations used to separate and isolate NMOS and PMOS devices in a peripheral area. The structures, materials depth of the STI and the deep or shallow trench isolation in different area can be different. Specific STI profile and material would be needed for certain device requirements.

As shown in FIG. 1B, a semiconductor device 10 includes a semiconductor substrate 100 and a trench isolation 110a. In some embodiments, the semiconductor substrate 100 is a silicon substrate. Other commonly used materials, such as carbon, germanium, silicon-germanium, gallium, arsenic, nitrogen, indium, phosphorus, and/or the like, may also be included in the semiconductor substrate 100. The semiconductor substrate 100 may be formed of a single-crystalline semiconductor material or compound semiconductor materials, and may be a bulk substrate or a semiconductor-on-insulator (SOI) substrate. The trench isolation 110a, such as a STI or a deep trench isolation, is used to separate and isolate photo diodes when the semiconductor device 10 is an image sensor, memory cells or SRAM cells, and is used to separate and isolate transistors when the semiconductor device 10 is a logic planar or FinFET devices. The trench isolation 110a is mainly formed by depositing dielectric materials in a trench etched in the semiconductor substrate 100.

The trench isolation 110a includes an epitaxial layer 111 and a dielectric material 112. The epitaxial layer 111 is peripherally enclosed by the semiconductor substrate 100, and the dielectric material 112 peripherally enclosed by the epitaxial layer 111. In some embodiments, the epitaxial layer 111 has a thickness ranging from 1 nm to 20 nm. In alternative embodiments, the epitaxial layer 111 is an undoped epitaxial layer, such as a pure Si epitaxial layer. The epitaxial layer 111 is formed by a selective epitaxial growth (SEG) operation, and has a low roughness, thus obtaining smoother sidewall and bottom surfaces of the trench for providing good isolaton.

The epitaxial layer 111 is an overlayer having one well-defined orientation with respect to the trench for smoothing an etched surface of the trench which is formed by etching. In some embodiments, the epitaxial layer 111 and the semiconductor substrate 100 are formed from the same material. Therefore, the dielectric material 112 overlying the smooth epitaxial layer 111 can provide better trench isolation. In some embodiments, a protection layer 130, such as oxide or $SiN_x$ or other dielectric materials, which is conformal to the well-defined epitaxial layer 111 may be optionally formed on the epitaxial layer 111, followed by a filling process to fill the trench with a dielectric material 112, thereby forming the trench isolation 110a. The dielectric material 112 may be a silicon oxide deposited using a high density plasma (HDP) chemical vapor deposition (CVD) process and referred to herein as an HDP oxide.

In certain embodiments, as shown in FIG. 1C, a semiconductor device 12 includes a semiconductor substrate 100 and a trench isolation 110b. In contrast to the trench isolation 110a shown in FIG. 1B, an epitaxial layer 111 of the corresponding trench isolation 110b includes at least one doped epitaxial layer 111a and an undoped epitaxial layer 111b. The undoped epitaxial layer 111b is disposed on the doped epitaxial layer 111a. In some embodiments, the doped epitaxial layer 111a has a thickness ranging from about 1 nm to about 10 nm, and the undoped epitaxial layer 111b has a thickness ranging from about 1 nm to about 10 nm. In some embodiments, the doped epitaxial layer 111a can be a single-layer structure or multi-layers structure, and a doped profile of the doped epitaxial layer 111a can be a box or gradient profile. The various thicknesses, dopant concentrations or dopant profile of the doped epitaxial layer 111a are used to meet different device requirements such as junction, leakage and strain engineering, and are not limited to the embodiments.

Figure 2A:
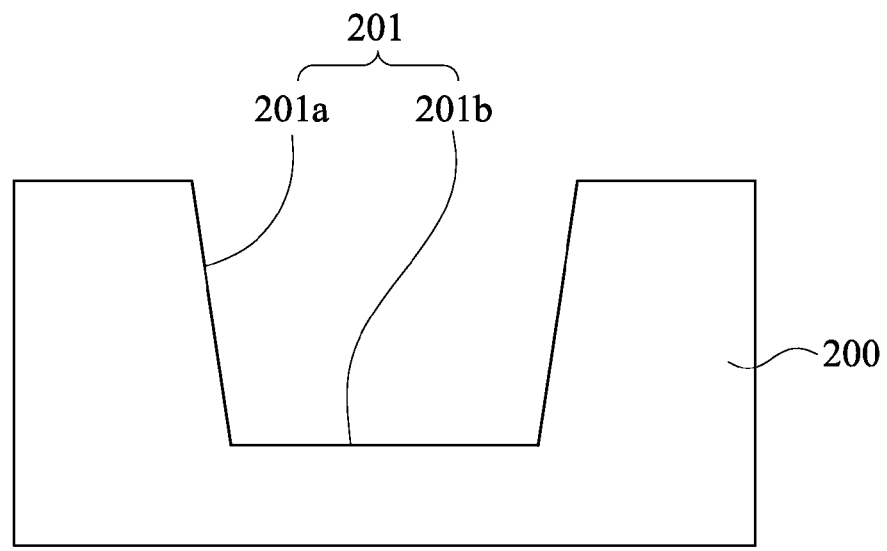

In some embodiments, the doped epitaxial layer 111a is, for example, a boron-doped Si epitaxial layer with a boron-doped concentration of $10^{18}$-$10^{21}$ per cubic centimeter, and the undoped epitaxial layer 111b is a pure Si epitaxial layer with low roughness. The doped epitaxial layer 111a is used to replace the conventional field implantation which requires patterning, implanting, thermal activated processes and cleaning operations. In addition, the passivation efficiency of conventional implant method is worse than in-situ epitaxy due to more serious implant damage, lower activation level and lower dopant concentration (<5E18 $cm^{-3}$) can be achieved. Therefore, the application of the doped epitaxial layer 111a may simplify the fabrication process. In some embodiments, the doped epitaxial layer 111a is, for example, a phosphor-doped, arsenic-doped or carbon-doped Si epitaxial layer. FIG. 2A-FIG. 2D are schematic cross-sectional views of intermediate stages showing a method for fabricating a semiconductor device in accordance with some embodiments. As shown in FIG. 2A, a semiconductor substrate 200 is provided. A trench 201 with a sidewall 201a and a bottom surface 201b is formed (such as by using a dry etching, wet etching, or combinations thereof) in the semiconductor substrate 200.

Figure 2B:
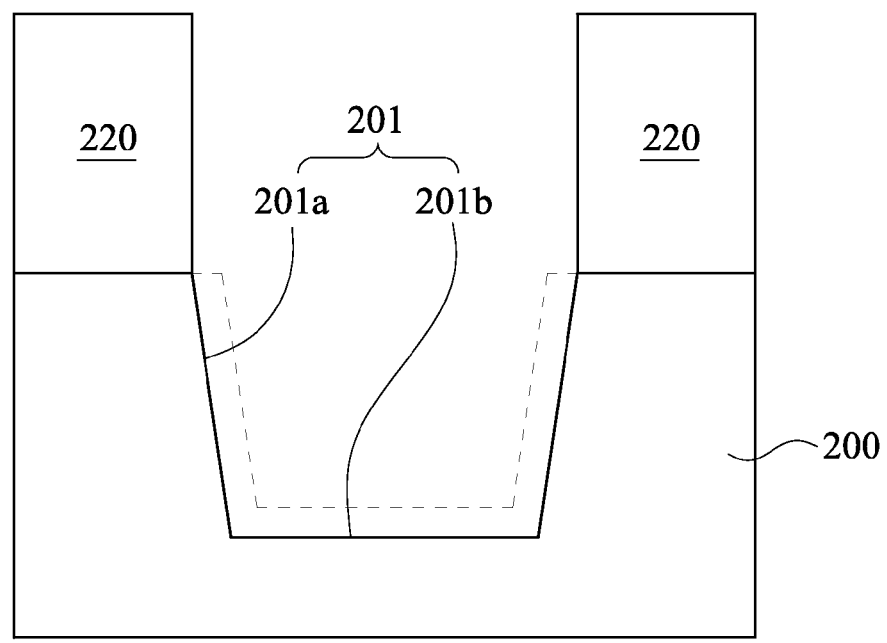

As shown in FIG. 2B, a portion of the sidewall 201a of the trench 201 and a portion of the bottom surface 201b of the trench 201 is etched out in a gaseous environment, such as $H_2$ and HCl, in which the portions of the sidewall 201a and the bottom surface 201b are rough and defective. Alternatively, the gaseous environment may further optionally include $GeH_4$ or other deposition gases like $SiCl_2H_2$ or $SiH_4$ and can use $Cl_2$ gas to replace HCl gas. In some embodiments, a flow rate of $H_2$ is in a range of about 5 standard liter per minute (slm) to about 50 slm, a flow rate of HCl is in a range of about 20 standard cubic centimeter per minute (sccm) to about 500 sccm and a flow rate of $GeH_4$ is in a range of about 0 sccm to about 500 sccm. The operation of etching out the portions of the sidewall 201a and the bottom surface 201b is preformed under a pressure range from about 5 torr to about 500 torr, a temperature range from about 400° C. to 800° C. for a period of time ranging from about 10 seconds to about 500 seconds. In some embodiments, the portion of the sidewall 201a removed has a thickness ranging from about 1 nm to about 10 nm, and the portion of the bottom surface 201b removed has a thickness ranging from about 1 nm to about 10 nm.

As shown in FIG. 2C1, an epitaxial layer 211 is formed conformal to the remaining portion of the sidewall 201a and the remaining portion of the bottom surface 201b. In some embodiments, the epitaxial layer 211, such as an undoped epitaxial layer, is formed in a gaseous environment containing $H_2$, $SiCl_2H_2$ and HCl. Alternatively, the gaseous environment may further include $GeH_4$ and a silane family such as $SiH_4$, $Si_2H_6$, $Si_3H_8$, and high order silane optionally. If the reaction gases are included $GeH_4$ precursor, it would tend to formation SiGe on STI bottom and sidewalls. Moreover, Si growth on STI sidewall is one of important applications. Different materials such as SiGe or III-V compounds can be deposited for special device needed. In some embodiments, a flow rate of $H_2$ is in a range of about 5 slm to about 50 slm, a flow rate of HCl is in a range of about 10 sccm to about 500 sccm and a flow rate of $SiCl_2H_2$ is in a range of about 20 sccm to about 500 sccm. The operation of forming the epitaxial layer 211 is preformed under a pressure range from about 5 torr to about 500 torr and a temperature range from about 400° C. to 800° C. for a period of time ranging from about 10 seconds to about 1000 seconds.

In some embodiments, a selective epitaxy growth (SEG) process is used to form the epitaxial layer 211 conformal to the remaining portion of the sidewall 201a and the remaining portion of the bottom surface 201b. For example, an oxide/nitride layer 220 formed on the semiconductor substrate 200 is first used as a hard mask for etching out the portion of the sidewall 201a of the trench 201 and the portion of the bottom surface 201b of the trench 201. Then, the selective epitaxy growth process is used to form the epitaxial layer 211 conformal to the remaining portion of the sidewall 201a and the remaining portion of the bottom surface 201b, using the oxide/nitride layer 220 formed on the semiconductor substrate 200 as the hard mask. In some embodiments, the oxide/nitride layer 220 is formed using chemical vapor deposition (CVD). In other embodiments, other deposition processes are alternatively used, such as plasma enhanced chemical vapor deposition (PECVD) and low pressure chemical vapor deposition (LPCVD).

In some embodiments, the operations of etching out the portions of the sidewall 201a and the bottom surface 201b and forming the epitaxial layer 211, as shown in FIG. 2B and FIG. 2C1, are included in an etch and epitaxy process. In some embodiments, the etch and epitaxy process is a selective in-situ etch and epitaxy process, i.e. the operations of etching out the portions of the sidewall 201a and the bottom surface 201b and forming the epitaxial layer 211 can be performed in the same processing chamber. For controlling the profile of the trench 201, the etch and epitaxy process can be repeatedly performed to reshape the sidewall 201a and the bottom surface 201b of the trench 201. At least one advantage of the controllable profile of the trench 201 is to control a top corner rounding radius $r_t$ and a bottom corner rounding radius $r_b$ of the trench for increasing the device quality. In some embodiments, the top corner shown in FIG. 2C2 would be pin-on (111) facet 240 which is formed by selective epitaxy deposition. For specific device and yield requirements, two kinds of profile controls can be achieved by cyclic deposition and etching (CDE) process. One of the two profiles can be defined as radius of curvature ($r_t$) which is shown in FIG. 2C1, and the other of the two profiles is a profile more conformal to the remaining portion of the sidewall 201a and the remaining portion of the bottom surface 201b more conformal profile shown in FIG. 2C2. As shown in FIG. 2C2, the larger effective STI width can be applied to increase the gap-filled ability in high-aspect ratio STI trench (aspect-ratio>4).

In some embodiments, the top corner rounding radius $r_t$ is 7 nm before the etch and epitaxy process is performed, and may be modified to 15 nm after the etch and epitaxy process is performed. On the other hand, the etch and epitaxy process may help to increase an aspect ratio width of a deep trench for filling a dielectric material in the deep trench easily.

Compared with the roughness of the etched sidewall 201a and bottom surface 201b shown in FIG. 2B, the roughness of the epitaxial layer 211 is smaller. In some examples, the roughness of the etched sidewall 201a and bottom surface 201b is about greater than 0.194 nm, but the roughness of the epitaxial layer 211 is about 0.168 nm. In some embodiments, the haze of the etched sidewall 201a and bottom surface 201b is about 0.546 ppm, but the haze of the epitaxial layer 211 is about 0.474 ppm.

Figure 2D:
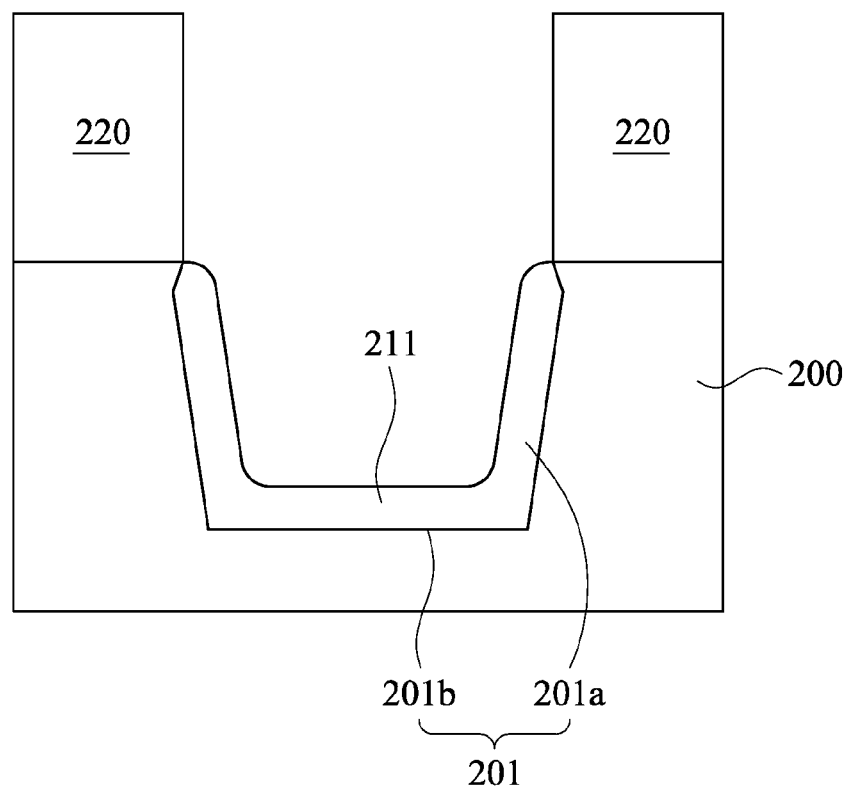
Figure 2D:
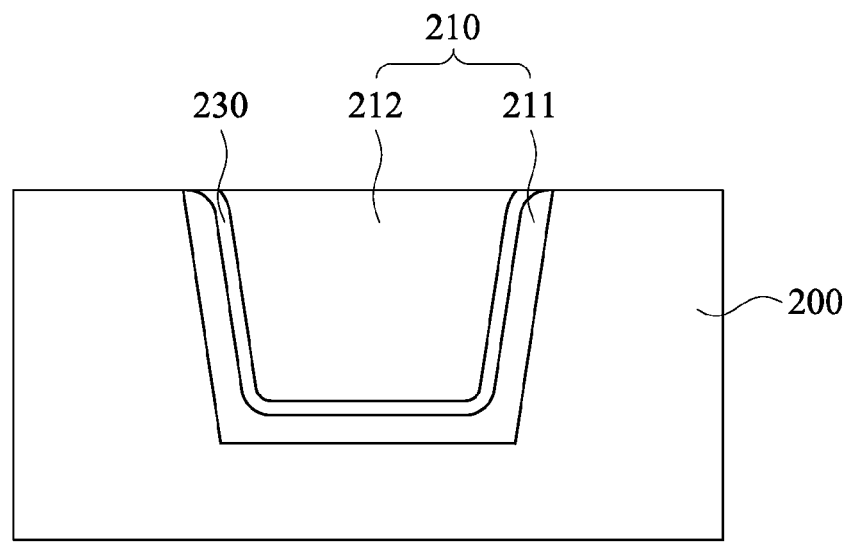

As shown in FIG. 2D, the trench is filled with a dielectric material 212 to form a trench isolation 210. In some embodiments, a protection layer 230 (which can be formed from oxide, $SiN_x$ or other dielectric materials) conformal to the epitaxial layer 211 may be formed using an in-situ steam generation (ISSG) tool or furnace tool to prevent from the plasma damage of HDP STI gap-fill process.

FIG. 3A-FIG. 3D are schematic cross-sectional views of intermediate stages showing a method for fabricating a semiconductor device in accordance with some embodiments. The processing methods used in FIG. 3A-FIG. 3D are similar to those in FIG. 2A-FIG. 2D, and are not repeated again.

Figure 3A:
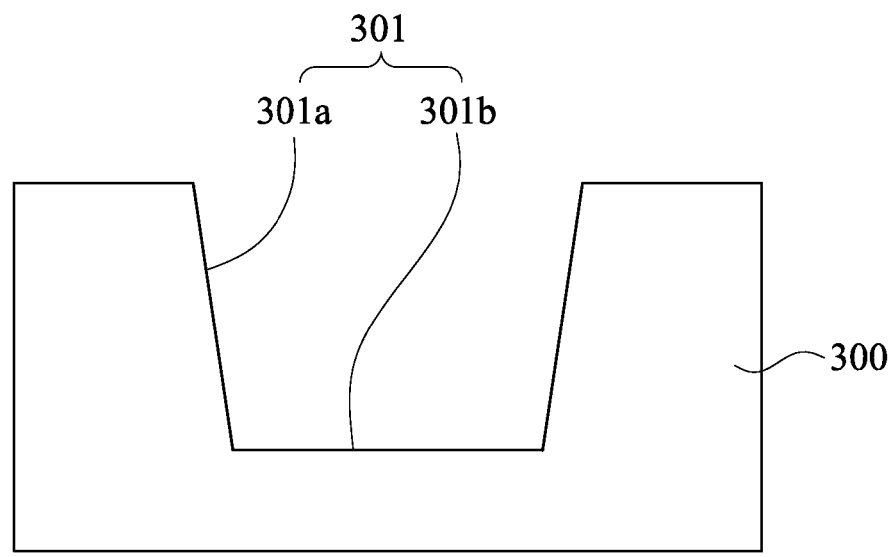
FIG. 3A-FIG. 3D are schematic cross-sectional views of intermediate stages showing a method for fabricating a semiconductor device in accordance with certain embodiments.

As shown in FIG. 3A, a semiconductor substrate 300 is provided. A trench 301 with a sidewall 301a and a bottom surface 301b is formed (such as by using a dry etching, wet etching, or combinations thereof) in the semiconductor substrate 300.

Figure 3B:
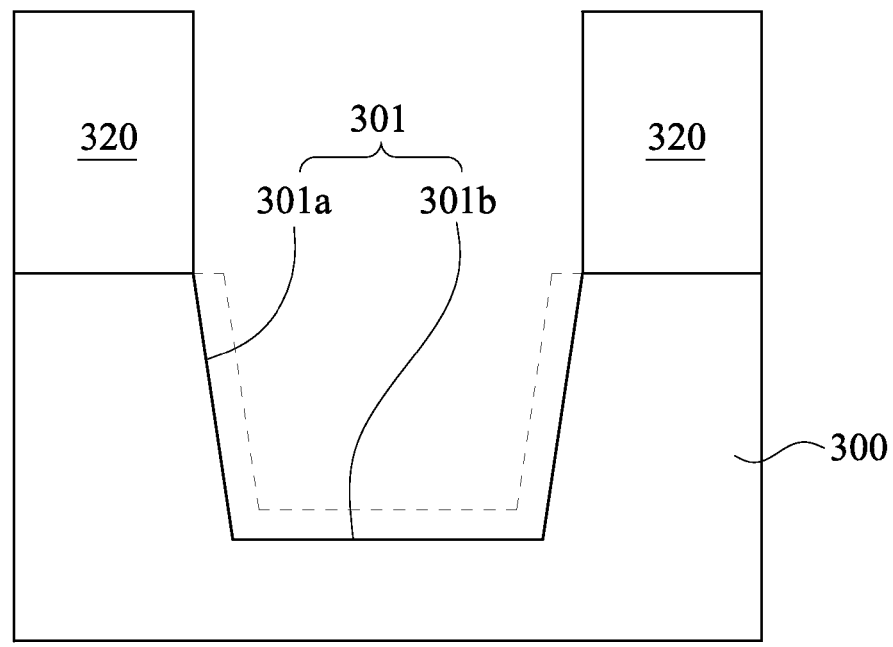

As shown in FIG. 3B, a portion of the sidewall 301a of the trench 301 and a portion of the bottom surface 301b of the trench 301 is etched out in a gaseous environment, such as $H_2$ and HCl, in which the portions of the sidewall 301a and the bottom surface 301b are rough and defective. In some embodiments, the portion of the sidewall 301a removed has a thickness ranging from about 1 nm to about 10 nm, and the portion of the bottom surface 301b removed has a thickness ranging from about 1 nm to about 10 nm.

Figure 3C:
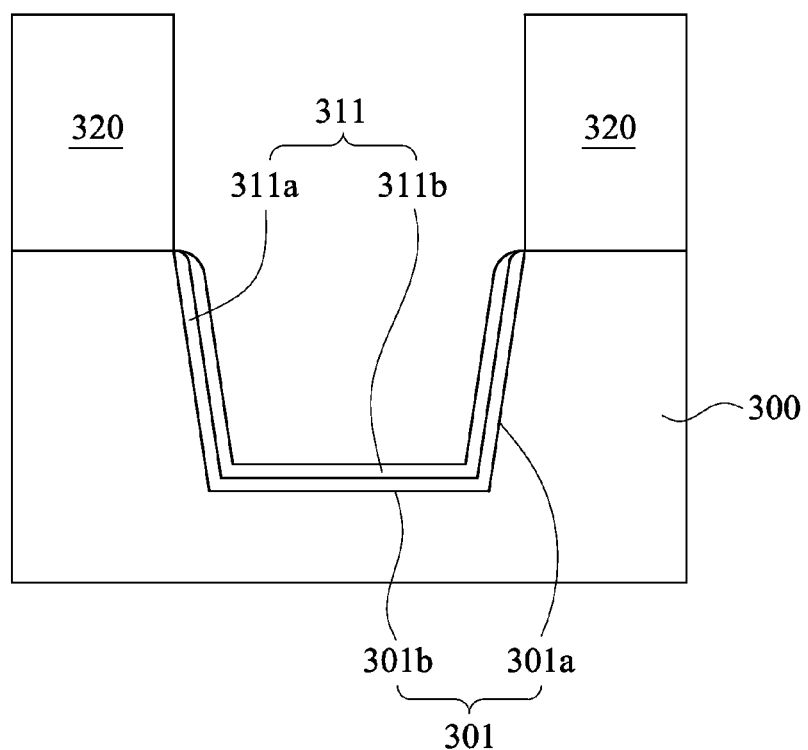

As shown in FIG. 3C, a doped epitaxial layer 311a is formed on the remaining portion of the sidewall 301a and the remaining portion of the bottom surface 301b first. In some embodiments, the doped epitaxial layer 311a is formed in a gaseous environment containing $H_2$, HCl, $SiCl_2H_2$ and $B_2H_6$, in which Boron dopant may be used in CIS application for creating an electrical potential barrier to prevent from interface traps recombination at Silicon and STI interfaces. For different application, various dopants such as C, As, P can also be used by using $SiCH_6$, $AsH_4$ and $PH_3$ precursors, respectively. For example, carbon dopant can be used to retard boron diffusion to well-control boron tailing profile after a high-temperature annealing process. Alternatively, the gaseous environment may further include $SiH_4$, $Si_2H_6$, $Si_3H_8$, and $GeH_4$ optionally. In some embodiments, a flow rate of $H_2$ is in a range of about 5 slm to about 50 slm, a flow rate of HCl is in a range of about 20 sccm to about 500 sccm, a flow rate of $SiCl_2H_2$ is in a range of about 20 to about 500 sccm and a flow rate of $B_2H_6$ is in a range of about 0.01 to about 10 sccm. The operation of forming the doped epitaxial layer 311a is preformed under a pressure range from about 5 torr to about 50 torr and a temperature range from about 400° C. to 800° C. for a period of time ranging from about 30 seconds to about 600 seconds.

Then, an undoped epitaxial layer 311b is formed on the doped epitaxial layer 311a. In some embodiments, the undoped epitaxial layer 311b is formed in a gaseous environment containing $H_2$, HCl and $SiCl_2H_2$. Alternatively, the gaseous environment may further include $GeH_4$ and a silane family such as $SiH_4$, $Si_2H_6$, $Si_3H_8$ and high order silane optionally. In some embodiments, a flow rate of $H_2$ is in a range of about 5 slm to about 50 slm, a flow rate of HCl is in a range of about 20 sccm to about 500 sccm and a flow rate of $SiCl_2H_2$ is in a range of about 2 to about 500 sccm. The operation of forming the undoped epitaxial layer 311b is performed under a pressure range from about 5 torr to about 500 torr and a temperature range from about 400° C. to 800° C. for a period of time ranging from about 30 seconds to about 600 seconds.

In some embodiments, a selective epitaxy growth (SEG) process is used to form the epitaxial layer 311 conformal to the remaining portion of the sidewall 301a and the remaining portion of the bottom surface 301b. For example, an oxide/nitride layer 320 formed on the semiconductor substrate 300 is first used as a hard mask for etching out the portion of the sidewall 301a of the trench 301 and the portion of the bottom surface 301b of the trench 301. Then, the selective epitaxy growth process is used to form the epitaxial layer 311 conformal to the remaining portion of the sidewall 301a and the remaining portion of the bottom surface 301b, using the oxide/nitride layer 320 formed on the semiconductor substrate 300 as the hard mask.

Figure 3D:
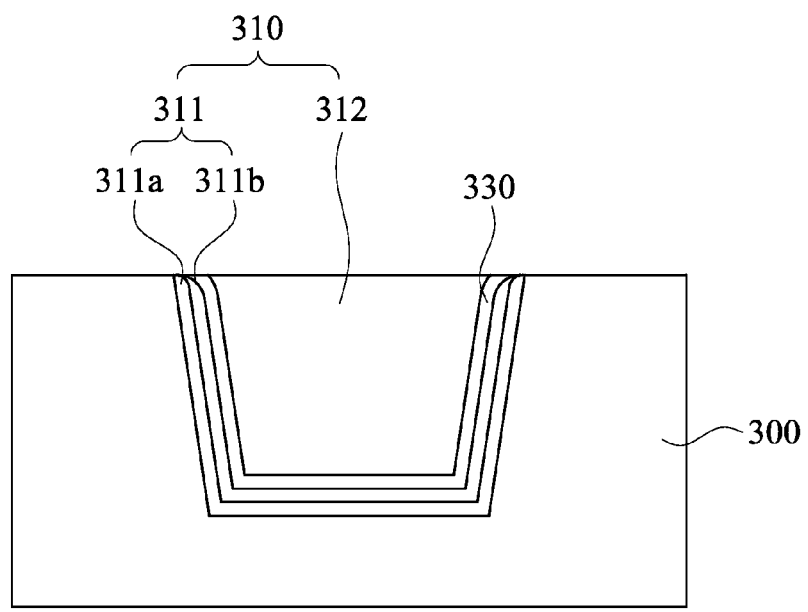

As shown in FIG. 3D, the trench 301 is filled with a dielectric material 312 to form a trench isolation 310. In some embodiments, a protection layer 230 (which can be formed from oxide, $SiN_x$ or other dielectric materials) conformal to the epitaxial layer 211 may be formed using an in-situ steam generation (ISSG) tool or furnace tool to prevent from the plasma damage of HDP STI gap-fill process.

Figure 4:
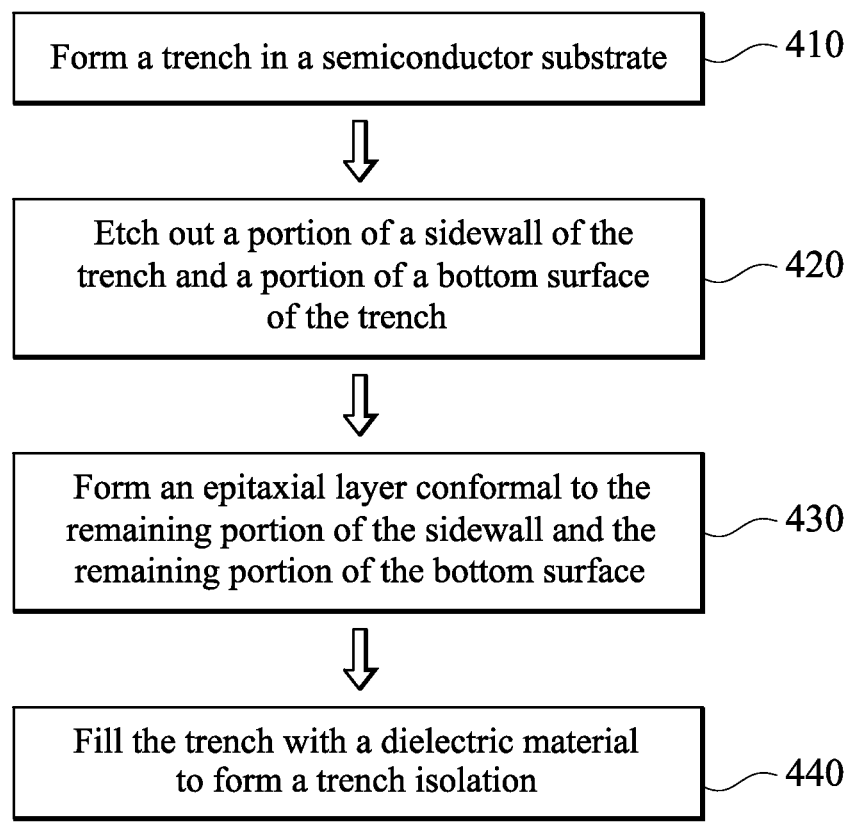
FIG. 4 is a flow chart of a method for fabricating a semiconductor device in accordance with various embodiments.

Referring to FIG. 4 with FIG. 2A-FIG. 2D, FIG. 4 is a flow chart of a method 400 for fabricating a semiconductor device in accordance with various embodiments. The method 400 begins at operation 410, where a trench 201 is formed in a semiconductor substrate 200 and has a sidewall 201a and a bottom surface 201b, as shown in FIG. 2A. At operation 420, a portion of the sidewall 201a of the trench 201 and a portion of the bottom surface 201b of the trench 201 are etched out, as shown in FIG. 2B. In some embodiments, the operation 420 can be omitted for simplifying the method 400.

At operation 430, an epitaxial layer 211 conformal to the remaining portion of the sidewall 201a and the remaining portion of the bottom surface 201b is formed, as shown in FIG. 2C. At operation 440, the trench 201 is filled with a dielectric material 212 to form a trench isolation 210, as shown in FIG. 2D.

In accordance with some embodiments, the present disclosure discloses a semiconductor device including a semiconductor substrate and a trench isolation. The trench isolation is located in the semiconductor substrate, and includes an epitaxial layer and a dielectric material. The epitaxial layer is peripherally enclosed by the semiconductor substrate. The dielectric material is peripherally enclosed by the epitaxial layer.

In accordance with certain embodiments, the present disclosure disclosed a method for fabricating a semiconductor device. In this method, a trench is formed in a semiconductor substrate. The trench has a sidewall and a bottom surface. At least one etch and epitaxy process is performed on the sidewall and the bottom surface of the trench. The etch and epitaxy process includes etching out a portion of the sidewall of the trench and a portion of the bottom surface of the trench and forming an epitaxial layer conformal to the remaining portion of the sidewall and the remaining portion of the bottom surface. The trench is filled with a dielectric material to form a trench isolation.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for fabricating a semiconductor device, the method comprising:
   forming a trench in a semiconductor substrate, the trench having a sidewall and a bottom surface;
   performing at least one etch and epitaxy process on the sidewall and the bottom surface of the trench, the etch and epitaxy process comprising:
   etching out a portion of the sidewall of the trench and a portion of the bottom surface of the trench; and
   forming an epitaxial layer conformal to the remaining portion of the sidewall and the remaining portion of the bottom surface; and
   filling the trench with a dielectric material to form a trench isolation,
   wherein the operation of forming the epitaxial layer comprises:
   forming a doped epitaxial layer on the remaining portion of the sidewall and the remaining portion of the bottom surface; and
   forming an undoped epitaxial layer on the doped epitaxial layer.

2. The method of claim 1, wherein the etch and epitaxy process comprises a plurality of selective in-situ etch and epitaxy processes.

3. The method of claim 1, wherein the operation of forming the epitaxial layer comprises forming the epitaxial layer conformal to the remaining portion of the sidewall and the remaining portion of the bottom surface using a selective epitaxy growth (SEG) process.

4. The method of claim 1, wherein the etch and epitaxy process comprises:
   etching out the portion of the sidewall of the trench and the portion of the bottom surface of the trench using an oxide/nitride layer formed on the semiconductor substrate as a hard mask; and
   forming the epitaxial layer conformal to the remaining portion of the sidewall and the remaining portion of the bottom surface using a selective epitaxy growth process, the selective epitaxy growth process using the oxide/nitride layer formed on the semiconductor substrate as the hard mask.

5. The method of claim 1, further comprising:
   repeatedly performing the etch and epitaxy process to control a top corner rounding radius and a bottom corner rounding radius of the trench.

6. The method of claim 1, wherein the doped epitaxial layer has a first thickness ranging from 1 nm to 10 nm and the undoped epitaxial layer has a second thickness ranging from 1 nm to 10 nm.

7. The method of claim 1, wherein the operation of forming the doped epitaxial layer comprises forming the doped epitaxial layer on the remaining portion of the sidewall and the remaining portion of the bottom surface in a gaseous environment containing $H_2$, HCl, $SiCl_2H_2$ and a precursor and the operation of forming the undoped epitaxial layer comprises forming the undoped epitaxial layer on the doped epitaxial layer in a gaseous environment containing $H_2$, HCl, $SiCl_2H_2$ $GeH_4$ and a silane group, wherein the precursor is $B_2H_6$, $PH_3$, $AsH_3$ or $SiCH_6$.

8. The method of claim 1, wherein the doped epitaxial layer is a boron-doped Si epitaxial layer with a boron-doped concentration of $10^{18}$-$10^{21}$ per cubic centimeter, and the undoped epitaxial layer is a pure Si epitaxial layer.

9. The method of claim 1, further comprising:
forming a protection layer conformal to the epitaxial layer.

10. The method of claim 1, wherein the operation of forming the epitaxial layer comprises forming the epitaxial layer conformal to the remaining portion of the sidewall and the remaining portion of the bottom surface in a gaseous environment containing $H_2$, HCl and $SiCl_2H_2$.

11. The method of claim 1, wherein the operation of etching out the trench comprises etching out the portion of the sidewall of the trench and the portion of the bottom surface of the trench in a gaseous environment containing $H_2$ and an etching gas selected from a group of HCl and Cl2.

12. A method for fabricating a semiconductor device, the method comprising:
forming a trench in a semiconductor substrate, the trench having a sidewall and a bottom surface;
forming an epitaxial layer conformal to the sidewall and the bottom surface; and
filling the trench with a dielectric material to form a trench isolation,
wherein the operation of forming the epitaxial layer comprises:
forming a doped epitaxial layer on the sidewall and the bottom surface; and
forming an undoped epitaxial layer on the doped epitaxial layer.

13. The method of claim 12, wherein the operation of forming the epitaxial layer comprises forming the epitaxial layer conformal to the sidewall and the bottom surface using a selective epitaxy growth (SEG) process.

14. The method of claim 12, further comprising:
repeatedly etching out a portion of the sidewall of the trench and a portion of the bottom surface of the trench and forming the epitaxial layer to control a top corner rounding radius and a bottom corner rounding radius of the trench.

15. The method of claim 12, wherein the doped epitaxial layer has a first thickness ranging from 1 nm to 10 nm and the undoped epitaxial layer has a second thickness ranging from 1 nm to 10 nm.

16. The method of claim 12, wherein the operation of forming the doped epitaxial layer comprises forming the doped epitaxial layer on the sidewall and the bottom surface in a gaseous environment containing $H_2$, HCl, $SiCl_2H_2$ and a precursor and the operation of forming the undoped epitaxial layer comprises forming the undoped epitaxial layer on the doped epitaxial layer in a gaseous environment containing $H_2$, HCl, $SiCl_2H_2$ $GeH_4$ and a silane group, wherein the precursor is $B_2H_6$, $PH_3$, $AsH_3$ or $SiCH_6$.

17. The method of claim 12, wherein the doped epitaxial layer is a boron-doped Si epitaxial layer with a boron-doped concentration of $10^{18}$-$10^{21}$ per cubic centimeter, and the undoped epitaxial layer is a pure Si epitaxial layer.

18. The method of claim 12, further comprising:
forming a protection layer conformal to the epitaxial layer.

19. The method of claim 12, wherein the operation of forming the epitaxial layer comprises forming the epitaxial layer conformal to the sidewall and the bottom surface in a gaseous environment containing $H_2$, HCl and $SiCl_2H_2$.

20. The method of claim 12, wherein the operation of forming the epitaxial layer comprises forming the epitaxial layer with a thickness ranging from 1 nm to 20 nm.

* * * * *